US006515548B2

United States Patent
Matsumoto et al.

(10) Patent No.: US 6,515,548 B2
(45) Date of Patent: Feb. 4, 2003

(54) TEMPERATURE COMPENSATED OSCILLATOR, ITS MANUFACTURING METHOD, AND INTEGRATED CIRCUIT FOR TEMPERATURE COMPENSATED OSCILLATOR

(75) Inventors: Toru Matsumoto, Tochigi-ken (JP); Masayuki Takahashi, Tochigi-ken (JP)

(73) Assignee: Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 09/862,429

(22) Filed: May 21, 2001

(65) Prior Publication Data

US 2001/0048349 A1 Dec. 6, 2001

(30) Foreign Application Priority Data

May 29, 2000 (JP) ........................................ 2000-157740

(51) Int. Cl.[7] ................................................ H03L 7/00
(52) U.S. Cl. ............................. 331/25; 331/44; 331/66; 331/176
(58) Field of Search ............................. 331/25, 44, 66, 331/70, 176

(56) References Cited

U.S. PATENT DOCUMENTS 4,456,892 A * 6/1984 Vandergraaf ................. 310/315
5,892,408 A * 4/1999 Binder ......................... 331/176

* cited by examiner

Primary Examiner—Robert Pascal
Assistant Examiner—Kimberly E Glenn
(74) Attorney, Agent, or Firm—Jordan and Hamburg LLP

(57) ABSTRACT

A temperature compensated oscillator has a frequency comparing circuit for comparing a frequency of an oscillating output signal of an oscillator circuit and a frequency of an external reference frequency signal externally inputted, and also has a sequential comparing register for determining each bit of a compensation datum based on this comparison. A digital signal from the sequential comparing register is applied to an input of a D/A converter for generating a control voltage of a varicap diode. The temperature compensated oscillator performs a self compensating operation for sequentially determining each bit of the sequential comparing register every frequency comparison, and conforming the frequency of the oscillating output signal to that of, the external reference frequency signal. The digital signal from the sequential comparing register is stored as compensating data corresponding to a detecting temperature of a temperature detector at that time. The compensating data are determined by performing the self compensating operation every predetermined temperature change detected by the temperature detector.

10 Claims, 4 Drawing Sheets

TEMPERATURE COMPENSATED OSCILLATOR, ITS MANUFACTURING METHOD, AND INTEGRATED CIRCUIT FOR TEMPERATURE COMPENSATED OSCILLATOR

BACKGROUND OF THE INVENTION

1. Field of the Invention

The present invention relates to a temperature compensated oscillator, its manufacturing method, and an integrated circuit for a temperature compensated oscillator, and particularly relates to a temperature compensated oscillator for correcting a change in frequency, due to a circumferential temperature of the oscillator, by digital control, its manufacturing method, and an integrated circuit for temperature compensated oscillator.

2. Description of the Related Art

In various kinds of communication devices such as a portable telephone, etc., a system clock having higher frequency accuracy is desired at present as communication speed is increased. Therefore, a temperature compensated crystal oscillator is used. FIG. 4 shows such a temperature compensated crystal oscillator. This temperature compensated crystal oscillator is constructed by externally attaching a crystal resonator XL to an integrated circuit for a temperature compensated crystal oscillator. The integrated circuit for the temperature compensated crystal oscillator is constructed by a varicap diode CV for adjusting an oscillating frequency of an oscillator circuit 41, a temperature detector 42, an A/D converter 43 for A/D-converting an output of the temperature detector 42, a non-volatile memory 44 for storing compensating data for temperatures experienced by the temperature compensated crystal oscillator, a correcting value signal generating circuit 45, and a D/A converter 46. The correcting value signal generating circuit 45 generates a correcting value signal on the basis of the compensating data address-designated by an output of the A/D converter 43 and read from the non-volatile memory 44. The D/A converter 46 D/A-converts the correcting value signal, and generates a control voltage of the varicap diode CV.

Temperature characteristics of the frequency accuracy of a crystal resonator (AT cut) generally used in a temperature compensated oscillator circuit can be approximated by a cubic function represented as follows.

$$\Delta f/f = A_3(T-T_0)^3 + A_1(T-T_0) + A_0$$

$T_0$ shows a reference temperature, and is different in accordance with an individual crystal together with a coefficient of the cubic function. For example, there are temperature characteristics of the frequency accuracy as shown in FIG. 3.

The oscillating frequency of the crystal oscillator circuit is provided as follows.

$$f_0 = f_s(1 + 1/(2C_0/C_1(1+C_L/C_0)))$$

Here, $f_s$, $C_0$ and $C_1$ respectively show a resonant frequency of the crystal, an equivalent parallel capacity and an equivalent series capacity, and $C_L$ shows a load capacity of the oscillator circuit. It should be understood from this formula that temperature compensation can be carried out by adjusting the frequency if $C_L$ can be changed in accordance with temperature T. The varicap diode is used as the equivalent series capacitor $C_L$.

The compensating data are set as follows in such a temperature compensated crystal oscillator. The oscillator is really constructed by connecting a crystal oscillator to the integrated circuit for temperature compensated crystal oscillation, and is arranged within a constant temperature bath. Then, a voltage is applied from the exterior to the varicap diode CV every setting of a predetermined temperature. A switch 47 of FIG. 4 is connected to the side of a terminal A in advance. An oscillating output signal of the oscillator is monitored, and a control voltage $V_c$ of the varicap diode for obtaining a predetermined frequency is specified, and characteristics of the D/A converter 46 at that temperature are measured. Each coefficient ($A_3$, $A_1$, $A_0$) of the cubic function and data for adjustment of the D/A converter 46 are calculated on the basis of these measuring data, and are stored to the non-volatile memory 44 as the compensating data corresponding to each temperature.

At the actual operating time, the compensating data are read in a state in which data obtained by A/D-converting analog temperature information detected by the temperature detector 42 are set to an address of the non-volatile memory 44. These compensating data are read and outputted to the correcting value signal generating circuit 45 so that a correcting value signal is generated. This correcting value signal is D/A-converted by the D/A converter 46 so that the control voltage $V_c$ of the varicap diode CV is generated. The switch 47 of FIG. 4 is connected to the side of a terminal B, and the control voltage $V_c$ is applied to the varicap diode CV.

In the conventional method, the compensating data are calculated by so-called off-line processing in which the measuring data at each temperature are once stored to an external device and are separately processed. Thereafter, the compensating data are written to the non-volatile memory. Therefore, it takes much cost and labor.

Further, temperature characteristics of the temperature detector 42, the A/D converter 43, the D/A converter 46 and the varicap diode CV, and frequency-temperature characteristics of the crystal resonator XL are individually different from each other. These different temperature characteristics are corrected by approximate values so that it is difficult to improve combination accuracy.

It is also very difficult to reduce cost and improve compensation accuracy since absolute exactness of temperature setting is required to extract the compensating data.

SUMMARY OF THE INVENTION

Therefore, an object of the invention is to provide a temperature compensated oscillator for which it is unnecessary to accurately set and detect temperature at a manufacturing time, and reduce manufacture cost of the temperature compensated oscillator.

In the invention, a temperature compensated oscillator has a frequency comparing circuit for comparing the frequency of an oscillating output signal of it and the frequency of an external reference frequency signal externally inputted, and also has a register for determining each bit on the basis of results of this comparison. A digital signal from the register is supplied to a D/A converter for generating a control voltage of a variable capacity element for adjusting the frequency of the oscillating output signal. A self compensating operation for sequentially determining each bit of the register on the basis of the comparing results of every comparison, and for conforming the frequency of the oscillating output signal to the frequency of the external reference frequency signal is provided. When the frequency of the oscillating output signal is conformed to the frequency of the external reference frequency signal, the digital signal from the register is set as compensating data corresponding to a detected temperature of a temperature detector at that time. The compensating data are determined by performing the self compensating operation every predetermined temperature change detected by the temperature detector. Thus, off-line processing is removed, and it is possible to reduce cost and labor for controlling an absolute temperature at a manufacturing time.

Further, combination accuracy can be also improved by correcting the characteristics of all elements in total.

Further, proper compensating data can be extracted by self-detecting a temperature change at a setting time of the compensating data so that no strictness of temperature setting is required. Therefore, it is expected that total cost performance of an adjustment is greatly improved.

A temperature compensated oscillator of the invention comprising a temperature detector for outputting an analog signal according to temperature, an A/D converter for converting the analog signal from the temperature detector to a digital signal, a memory from which compensating data are read using the digital signal from the A/D converter as an address, a D/A converter for converting the compensating data from the digital signal to the analog signal, a variable capacity element set by the analog signal from the D/A converter as a control voltage, an oscillator circuit for generating an oscillating output signal by oscillating a resonator such as a crystal resonator and a surface acoustic wave resonator, by using the variable capacity element as a frequency adjusting element of the oscillating output signal, a frequency comparing circuit for comparing frequencies of the oscillating output signal and an external reference frequency signal externally inputted, a register for sequentially determining a value of each bit of the register on the basis of frequency comparing results of the frequency comparing circuit, and a switching circuit for selectively supplying the compensating data read from the memory and the digital signal outputted from the register to the D/A converter; wherein the oscillator circuit performs an oscillating operation using the digital signal outputted from the register to the D/A converter through the switching circuit; the frequency of the oscillating output signal is changed by sequentially determining the value of each bit of the register on the basis of the comparing results of the frequency comparing circuit every comparing operation; the frequency of the oscillating output signal of the oscillator circuit and the frequency of the external reference frequency signal are conformed to each other; and the digital signal outputted from the register at a time when the frequency conforming occurs is written to the memory as the compensating data corresponding to a detecting temperature of the temperature detector every predetermined temperature step in a state in which the digital signal outputted from the A/D converter in accordance with the detecting temperature at that time is set as an address.

The invention also resides in a manufacturing method of a temperature compensated oscillator which comprises; a process for constructing a temperature compensated oscillator using a temperature detector for outputting an analog signal according to temperature, an A/D converter for converting the analog signal from the temperature detector to a digital signal, a memory from which compensating data are read using the digital signal from the A/D converter as an address, a D/A converter for converting the compensating data from the digital signal to an analog signal, a variable capacity element set using the analog signal from the D/A converter as a control voltage, an oscillator circuit connected to a resonator such as a crystal resonator, and generating an oscillating output signal by performing an oscillating operation according to the resonator, and using the variable capacity element as a frequency adjusting element of the oscillating output signal, a frequency comparing circuit for comparing frequencies of the oscillating output signal and an external reference frequency signal externally inputted, a register for sequentially determining a value of each bit on the basis of frequency comparing results of the frequency comparing circuit, and a switching circuit for selectively supplying the compensating data read from the memory and the digital signal outputted from the register to the D/A converter; a process for operating the temperature compensated oscillator at a predetermined specific temperature; a process for inputting the external reference frequency signal to the frequency comparing circuit; a process in which the oscillator circuit performs an oscillating operation by supplying the digital signal outputted from the register to the D/A converter through the switching circuit, and the frequency of the oscillating output signal is changed by sequentially determining the value of each bit of the register on the basis of the comparing results of the frequency comparing circuit every comparing operation, and the frequency of the oscillating output signal of the oscillator circuit and the frequency of the external reference frequency signal are conformed to each other; a process for writing the digital signal outputted from the register at a time when the frequency conforming occurs to the memory as the compensating data corresponding to a detecting temperature of the temperature detector in a state in which the digital signal outputted from the A/D converter in accordance with the detecting temperature at that time is set to an address; and a process for writing the compensating data required within a predetermined temperature compensating range to the memory by changing a circumferential temperature of the temperature compensated oscillator at a predetermined speed from the specific temperature so as to cross the predetermined temperature compensating range, and performing the writing operation of the compensating data every predetermined temperature step. The specific temperature preferably lies outside the temperature compensating range.

An integrated circuit for temperature compensated oscillation is also preferably constructed by integrating each construction of the temperature compensated oscillator except for the resonator in one chip.

In the temperature compensated oscillator, its manufacturing method and the integrated circuit for temperature compensated oscillator, it is also preferable that the temperature step corresponds to a predetermined changing width of the detecting temperature of the temperature detector, and the temperature step is partitioned when the digital signal outputted from the A/D converter shows the predetermined changing width. It is also preferable that the temperature step is narrowly set in a temperature range in which a temperature fluctuation of frequency accuracy of the oscillator becomes large. It is further preferable that the resonator is a crystal resonator, and the variable capacity element is a varicap diode.

DESCRIPTION OF THE PREFERRED EMBODIMENTS

Figure 1:
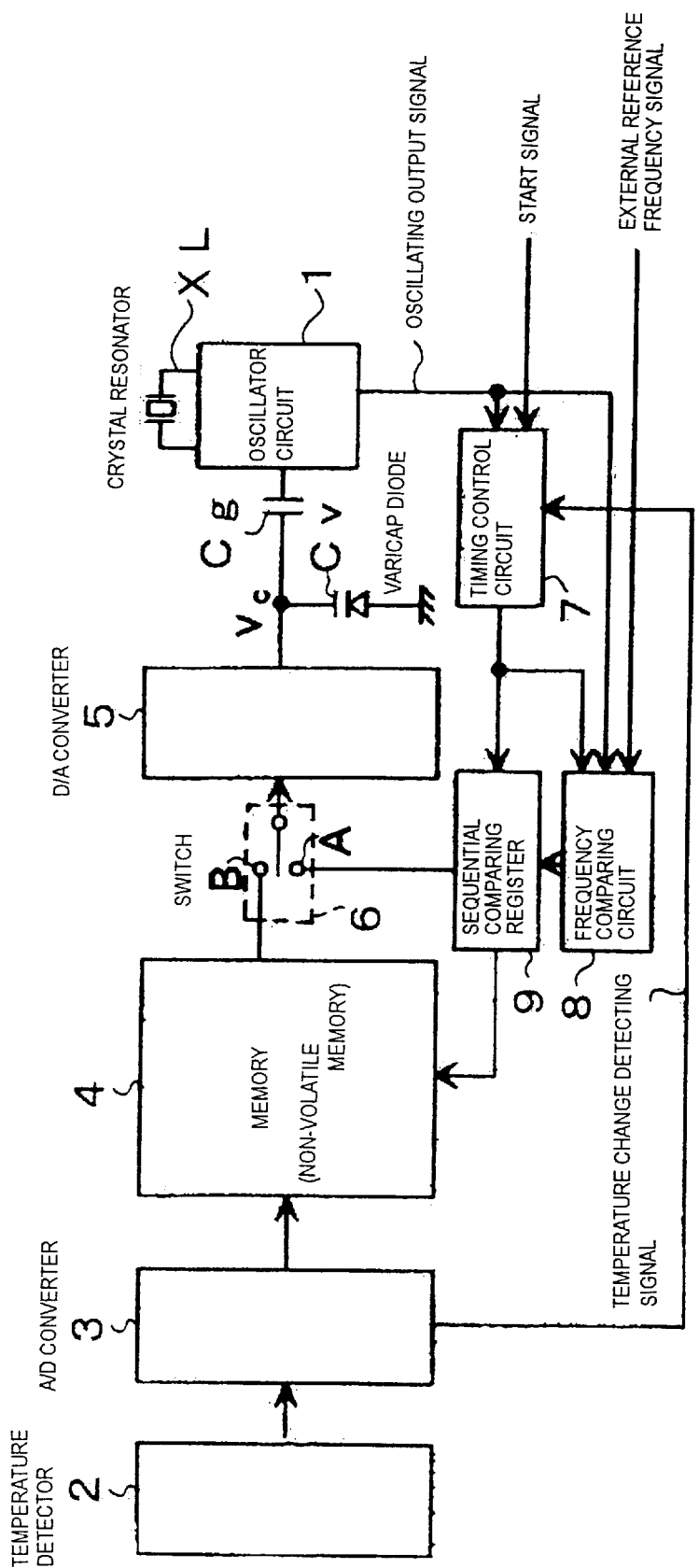
FIG. 1 is a block diagram of A construction of a temperature compensated crystal oscillator in an embodiment of the invention.

A temperature compensated oscillator, its manufacturing method, and an integrated circuit for temperature compensated oscillation in the present invention will next be explained in detail in accordance with a first embodiment shown in FIG. 1. FIG. 1 is a block diagram of a construction of a temperature compensated crystal oscillator of this embodiment. The construction of the temperature compensated crystal oscillator of this embodiment will first be explained with reference to FIG. 1.

In an oscillator circuit 1, a crystal resonator XL as a resonator is connected between input and output terminals of an unillustrated CMOS inverter. The crystal resonator XL is an AT cut crystal resonator. A varicap diode CV, used as a variable capacity element is connected in series to a load capacitor Cg of the oscillator circuit 1. A capacity value of the varicap diode CV is controlled by applying a control voltage from a D/A converter, described below to this connection point so that an oscillating output signal compensated in temperature is generated from the oscillator circuit 1. The oscillator circuit 1 is not limited to the construction of the CMOS inverter, but may be also constructed as a Colpitts oscillator circuit using a bipolar transistor. If frequency can be adjusted by using the variable capacity element such as a varicap diode, it is sufficient as the oscillator circuit.

A temperature detector 2 is constructed by a circuit utilizing temperature dependence of a forward voltage $V_{BE}$ of P/N junction, etc., and outputs a voltage according to temperature. For example, the temperature detector 2 is constructed by a semiconductor temperature sensor as disclosed in Japanese Patent Laid-Open No. 122976/1998. An A/D converter 3 A/D-converts the output voltage of the temperature detector 2, and generates a digital signal for designating an address of a non-volatile memory 4. Compensating data are stored to the non-volatile memory 4 as a memory by a manufacturing method of this embodiment described later. A D/A converter 5 receives the compensating data read from the non-volatile memory 4, or a digital signal from a sequential comparing register described later through a switch 6. The D/A converter 5 then D/A-converts the compensating data or the digital signal, and generates the control voltage of the varicap diode CV.

A timing control circuit 7 extracts the compensating data at each temperature by controlling operations of a frequency comparing circuit 8 and the sequential comparing register 9 used as a register in the manufacturing method of this embodiment described below, and writes these compensating data to the non-volatile memory 4.

The frequency comparing circuit 8 receives an external reference frequency signal of a predetermined frequency from an unillustrated external oscillator circuit and an oscillating output signal from the oscillator circuit 1, and compares frequencies of both the signals. The frequency comparing circuit 8 is constructed by a pair of binary counters using a flip flop, and a comparing circuit for discriminating whether counting values of these counters are large or small although this construction is not illustrated. The frequency comparing circuit 8 counts the number of external reference frequency signals and the number of oscillating output signals from the oscillator circuit 1 for a constant period. The frequency comparing circuit 8 discriminates whether these counting values are large or small, and outputs the counting values as frequency comparing results. For example, when the frequency of the oscillating output signal (hereinafter called an oscillating frequency) of the oscillator circuit 1 is lower than that of the external reference frequency signal, the frequency comparing circuit 8 outputs "1". In contrast to this, when the frequency of the oscillating output signal is higher than that of the external reference frequency signal, the frequency comparing circuit 8 outputs "0".

In this embodiment, the sequential comparing register 9 is a register of nine bits. When the compensating data are set, the sequential comparing register 9 transmits its output to the D/A converter 5, and controls the oscillating frequency of the oscillator circuit 1. Further, the sequential comparing register 9 sequentially determines a value of the oscillating frequency from a most significant bit in accordance with comparing results of the frequency comparing circuit 8 under control of the timing control circuit 7. The sequential comparing register 9 then feeds this value back to the oscillating frequency of the oscillator circuit 1, and conforms this value to a value for oscillating at a frequency of the external reference frequency signal so that the compensating data are extracted every temperature.

Each of the above constructions is integrated in an unillustrated one-chip IC as an integrated circuit for temperature compensated oscillation except for the crystal resonator XL.

Figure 2:
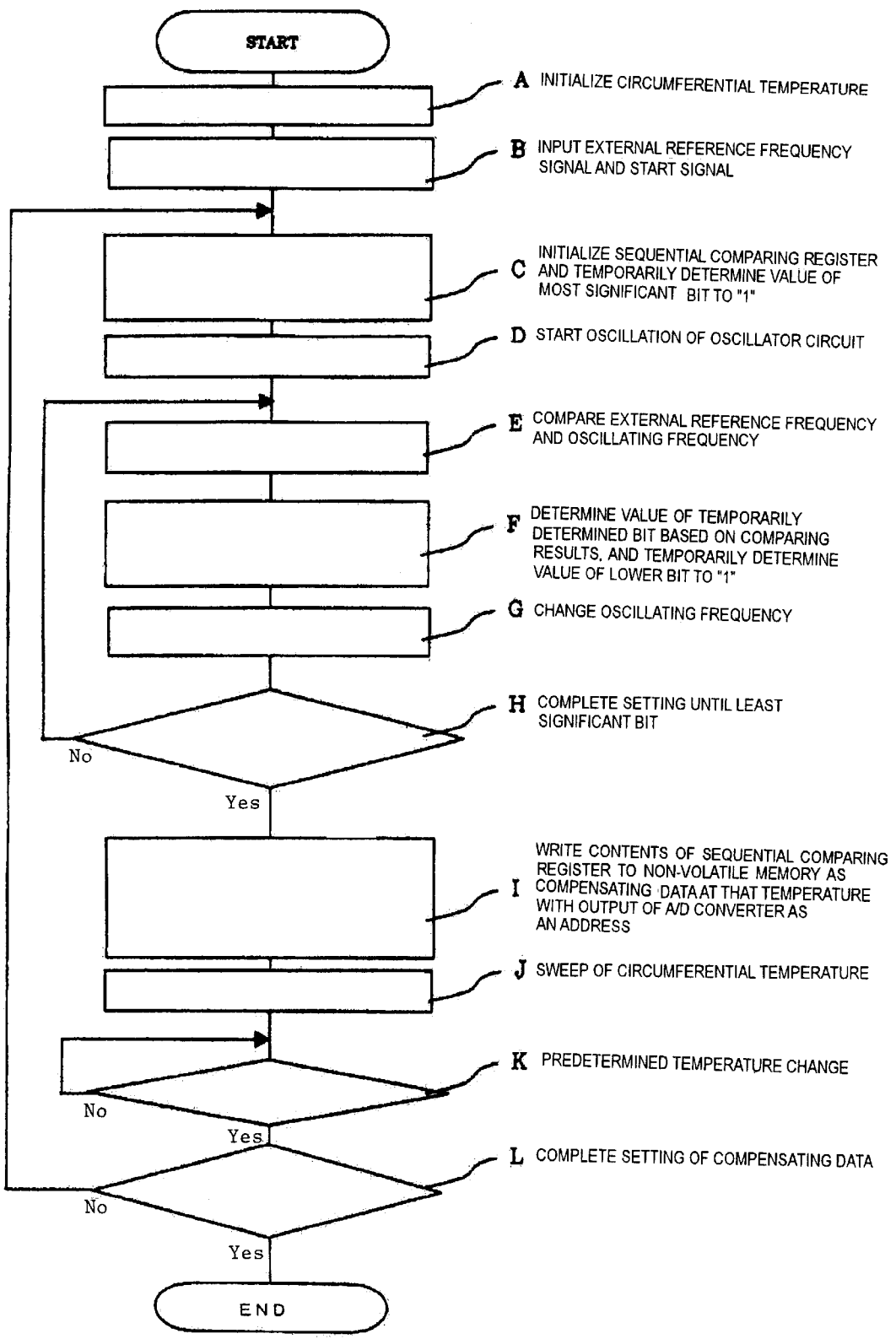
FIG. 2 is a flow chart of a manufacturing method of the temperature compensated crystal oscillator in the embodiment of the invention.

An operation for setting the compensating data to the non-volatile memory in the manufacturing method of this embodiment, i.e., at a manufacturing stage will next be explained in accordance with the flow chart of FIG. 2.

The temperature compensated crystal oscillator shown in FIG. 1 is constructed by externally attaching the crystal resonator XL to the one chip IC, and the switch 6 connected to the side of the terminal A this assembly is then exposed within a constant temperature bath. For example, the temperature of the constant temperature bath is set to a predetermined temperature such as 85° C. (on a high or low temperature side from a temperature range to be compensated in consideration of dispersion of the temperature detector), and is sufficiently stabilized (step A). Thereafter, a start signal is transmitted from the exterior of the temperature compensated crystal oscillator to the timing control circuit 7, and an external reference frequency signal is transmitted to the frequency comparing circuit 8, and a compensating data setting operation is started (step B).

When the compensating data setting operation is started, the timing control circuit 7 sets a most significant bit of the sequential comparing register 9 to "1", and sets each bit lower than this most significant bit to "0"(step C).

In an initial state, a digital signal constructed by the value of each bit of the sequential comparing register 9 is D/A-converted by the D/A converter 5 so that a control voltage of the varicap diode CV is generated at a terminal VC. Since only the most significant bit of the sequential comparing register 9 is set to "1", the control voltage becomes an intermediate value in its variable range. A capacity value of the varicap diode CV is determined by the control voltage, and the oscillator circuit 1 is oscillated at a frequency according to this value (step D).

In the timing control circuit 7, the frequency comparing circuit 8 next compares the oscillating output signal of the oscillator circuit 1 and the external reference frequency signal (step E). The frequency comparing circuit 8 counts the number of external reference frequency signals and the number of oscillating output signals from the oscillator circuit 1 for a constant period, and discriminates whether these counting values are large or small. When the oscillating frequency of the oscillator circuit 1 is lower than the frequency of the external reference frequency signal, the frequency comparing circuit 8 outputs "1". In contrast to this, when the oscillating frequency of the oscillator circuit 1 is higher than the frequency of the external reference frequency signal, the frequency comparing circuit 8 outputs "0".

The value of a bit temporarily determined as "1" in advance in the sequential comparing register 9 is determined in accordance with a comparing result of the frequency comparing circuit 8, and the value of a bit located by one on a lower side is temporarily determined to be "1" (step F). When the comparing result of the comparing circuit 8 shows "1", i.e., when the oscillating frequency is lower than the frequency of the external reference frequency signal, the temporarily determined bit, the most significant bit in the initial state is determined to be "1", and a second bit from the most significant bit is temporarily determined to be "1", and the control voltage of the varicap diode CV is increased. In contrast to this, when the comparing result of the comparing circuit 8 shows "0", i.e., when the oscillating frequency is higher than the frequency of the reference oscillating output signal, the most significant bit is determined to be "0", and a second bit from the most significant bit is temporarily determined to be "1", and the control voltage of the varicap diode CV is reduced. Thus, the oscillating frequency of the oscillator circuit 1 is changed (step G).

The timing control circuit 7 judges whether a least significant bit of the sequential comparing register 9 is determined or not (step H). If no least significant bit is determined, it is returned to the step E, and the frequency comparing circuit 8 compares the oscillating output signal and the external reference frequency signal (step E). A bit temporarily determined on the comparing result, here, a second bit from the most significant bit is determined, and a bit lower by one than this second bit, here, a third bit from the most significant bit is temporarily determined to be "1" (step F). The oscillating frequency of the oscillator circuit 1 is changed (step G). Thus, while the operations of steps E to H are repeated and the value of each bit is sequentially determined from the most significant bit to a lower order side, the oscillating frequency approaches the frequency of the external reference frequency signal. When the determination is made by such a self compensating operation until the least significant bit, the oscillating frequency is conformed to the frequency of the external reference frequency signal, and can be set to a predetermined frequency with high accuracy.

When all values of respective bits of the sequential comparing register 9 are determined, contents of the respective bits of the sequential comparing register 9 are written to the non-volatile memory 4 as compensating data corresponding to the temperature of the constant temperature bath at that time in a state in which a digital signal obtained by A/D-converting an output of the temperature detector 2 by the A/D converter 3 is set as an address (step I).

Thus, in a state in which the construction as the temperature compensated oscillator circuit is completely arranged, the digital signal from the sequential comparing register 9 extracted by the self compensating operation, and D/A-converted by the D/A converter 5 is stored for generating the control voltage for actual use. Thus, a control voltage for realizing an oscillating output signal of a predetermined frequency is written by the digital signal to the non-volatile memory 4 and is used as compensating data in a state in which the digital signal obtained by A/D-converting the output of the temperature detector 2 is set as an address. Accordingly, the compensating data can be extracted with high accuracy irrespective of dispersion of temperature characteristics of the crystal resonator XL, the varicap diode CV, the A/D converter 3, the D/A converter 5, etc. and absolute accuracy of the temperature detector 2. Further, the digital signal used as an input of the D/A converter 5 for generating the control voltage for adjusting the oscillating frequency is determined by performing the self compensating operation for each bit so that the compensating data with high accuracy can be obtained.

It is next judged whether the compensating data of every predetermined temperature step are written to the non-volatile memory 4 or not (step J). The next compensating data setting operation is started every temperature step.

The set temperature of the constant temperature bath is gradually changed at a predetermined speed from a high temperature side to a low temperature side (hereinafter this is called "swept") (step K).

The timing control circuit 7 receives the digital signal from the A/D converter 3. When a value shown by this digital signal is changed by a predetermined value, a predetermined temperature change, i.e., a predetermined temperature step is detected by the temperature detector 2 (step L). Operations after the step C are performed with this detection as a start signal. In this temperature step, the digital signal from the sequential comparing register 9 for realizing the oscillating output signal of a frequency actually approximately equal to the external reference frequency is also written to the non-volatile memory 4 as compensating data in a state in which the digital signal obtained by A/D-converting the output of the temperature detector 2 is set as an address. When the predetermined temperature change is detected by the temperature detector 2, the compensating data begin to be extracted at every temperature step. Accordingly, the compensating data can be extracted every temperature step irrespective of a circumferential temperature of the temperature compensated crystal oscillator, i.e., temperature setting accuracy of the constant temperature bath. Thus, it is possible to reduce cost and labor for controlling a set temperature at a manufacturing time.

As mentioned above, the compensating data for every temperature step are written to the non-volatile memory 4 by repeating the operations of steps C to L. When the compensating data are completely written in all predetermined temperature steps (step J), a compensating data setting operation of this embodiment is completed (END).

As mentioned above, the extraction of the compensating data and the writing of the compensating data to the non-volatile memory 4 are performed on line in the manufacturing method of this embodiment. Further, since the compensating data are calculated using an assembly of all element characteristics, accuracy can be improved.

The switch 6 is connected to the side of the terminal B in actual use. The compensating data are read from the non-volatile memory 4 in a state in which the digital signal obtained by A/D-converting the output of the temperature detector 2 outputted in accordance with the circumferential temperature is set as an address. The compensating data are then D/A-converted by the D/A converter 5, and are applied to the varicap diode CV as a control voltage. Thus, the frequency of the oscillating output signal of the oscillator circuit 1 is conformed to the frequency of the external reference frequency signal used at the manufacturing time.

For example, detailed contents of accuracy obtained in this embodiment and each construction for realizing this accuracy are as follows.

The frequency comparing circuit 8 uses a binary counter using a flip flop, and a circuit for discriminating whether a counting value is large or small. The frequency comparing circuit 8 counts the number of oscillating output signals from the oscillator circuit and the number of reference frequency signals from the external reference oscillator for a constant period, and discriminates whether the counting values are large or small. When 22 bits are used as a bit number of the counter of such a frequency comparing circuit 8, it is possible to make a comparing judgment with an accuracy of $1/2^{22}$ (about 0.24 ppm). A time required for this count is different in accordance with the frequency of the oscillator. In the case of 10 MHz, this time becomes about 0.42 second from $2^{22}/(10 \times 10^6)$.

When the sequential comparing register is constructed by 9 bits, it is necessary that the speed of temperature sweep for setting a time required to extract the compensating data at one temperature to 0.42×9=3.78 seconds is a speed set to such an extent that no temperature change during this time has an influence on a predetermined desirable accuracy. For example, the temperature change during this time is restrained to a value equal to or smaller than 0.1° C. A fluctuation in resonant frequency of the crystal oscillator is about 20 ppm when solid dispersion and temperature fluctuation are included. Therefore, when an adjustment is made in a step of 0.25 ppm at its maximum, a step number required for the D/A converter 5 becomes 20 ppm/0.25 ppm=80 steps, and a bit number of the D/A converter 5 becomes 7 bits. However, when non-linearity of voltage-capacity of the varicap diode and solid fluctuation are considered, 8 to 9 bits are actually set. Accordingly, 9 bits are set in this embodiment.

A bit number required for the A/D converter 3 for converting the output of the temperature detector 2 to an address of the non-volatile memory 4 can be calculated as follows. Since a maximum value of the temperature fluctuation of the resonant frequency is about 1 ppm/°C., compensating accuracy is set to 0.25 ppm, and a temperature range is set to range from −40° C. to 85° C. In this case, a required temperature step number becomes 125×1 ppm/0.25 ppm= 500 so that a bit number of the A/D converter 3 becomes 9 bits. When the above construction is used as it is, required capacity of the non-volatile memory 4 becomes 500×9=4.5 K bits as a bit number. In this embodiment, since the compensating data are stored to the non-volatile memory 4 with the digital signal outputted from the A/D converter 3 as an address, the required capacity of the non-volatile memory can be minimized.

For example, when a time taken to extract the compensating data in one temperature step is 3.78 seconds and a temperature change during this time is 0.1° C. and the temperature step is 0.25° C. and a temperature step number is 500, a time taken to extract all the compensating data becomes (0.25/(0.1/3.78))×500=4725 seconds (78.75 minutes). Thus, all the compensating data can be extracted in a relatively short time in dependence on bit numbers of a counter, the D/A converter and the A/D converter determined by required accuracy, and the speed of temperature sweep.

Figure 3:
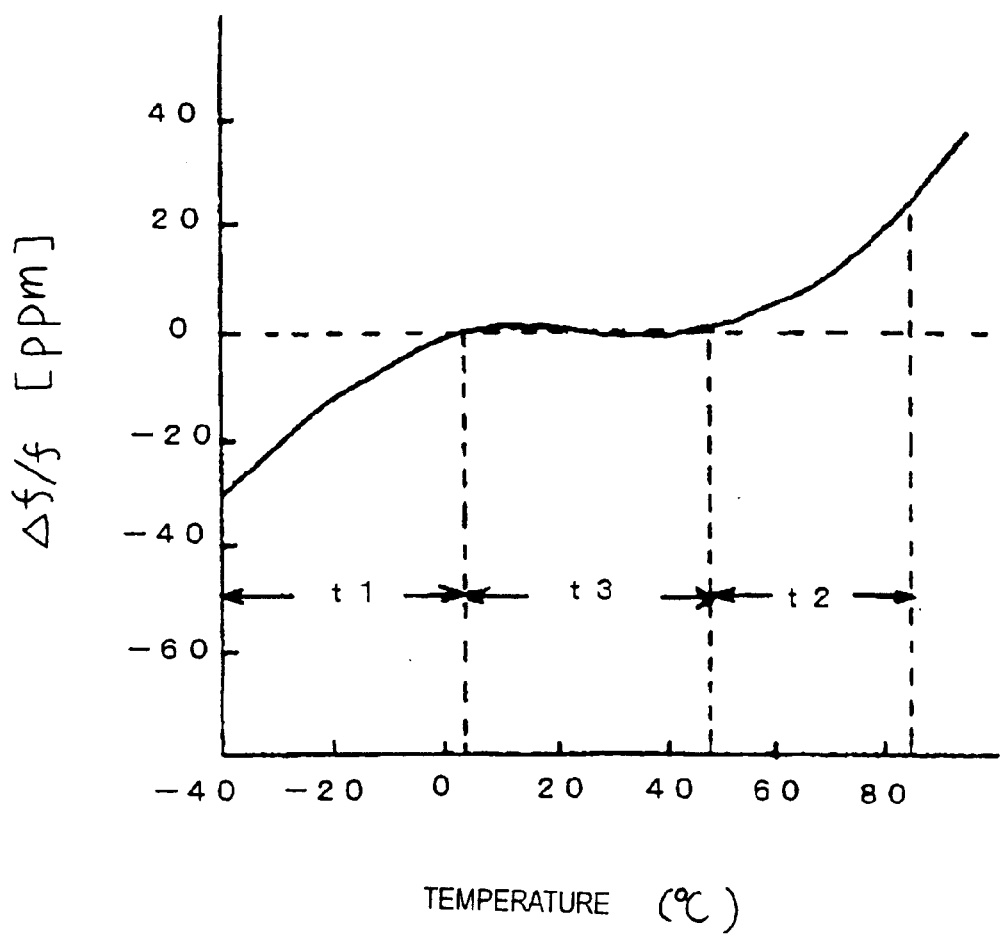
FIG. 3 is a characteristic view showing temperature characteristics of the frequency accuracy of a crystal resonator.
Figure 4:
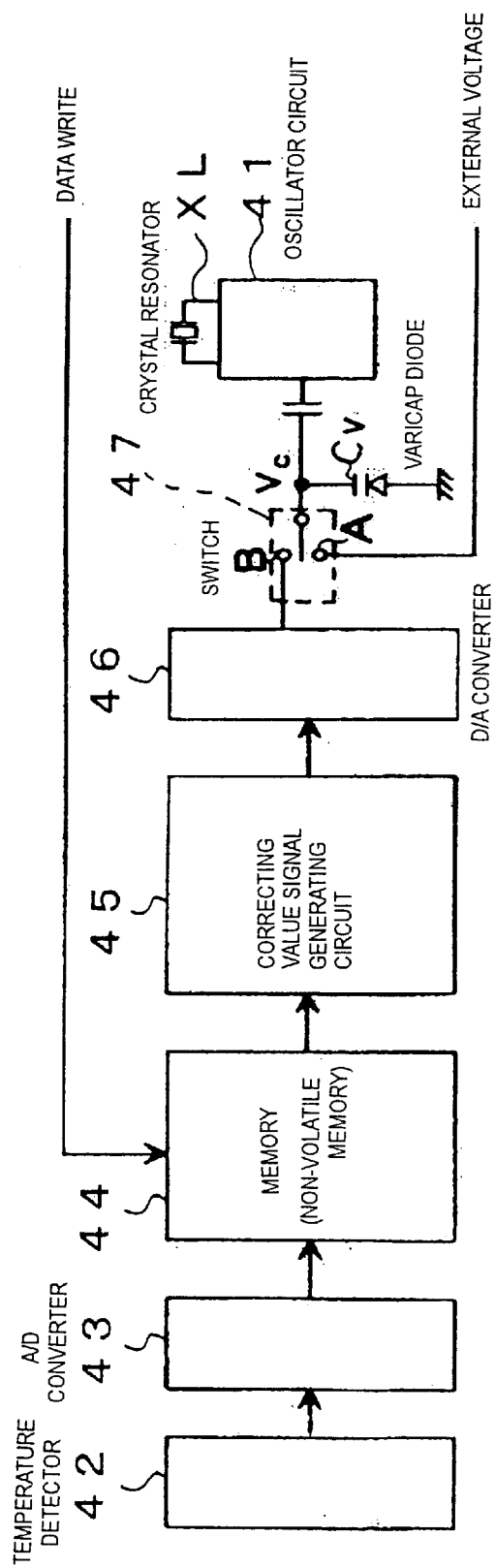
FIG. 4 is a block diagram of a construction of a conventional temperature compensated crystal oscillator.

In a method for further reducing the required capacity of the non-volatile memory 4, it is possible to increase the temperature step for adjusting frequency in an area where the temperature fluctuation of the frequency accuracy is small, or to increase the temperature step in all ranges and to interpolate between the steps, and combine both. For example, if temperature characteristics of the frequency accuracy of the crystal resonator are provided as shown in FIG. 3, the temperature step is set to be decreased in temperature ranges t1, t2 large in the temperature fluctuation of the frequency accuracy, and is set to be increased in a temperature range t3 small in the temperature fluctuation of the frequency accuracy.

In this embodiment, an initial temperature of the constant temperature bath is set to a temperature higher than a temperature range to be compensated, and temperature is swept from a high temperature side to a low temperature side. However, conversely, the initial temperature may be set to a temperature lower than the temperature range to be compensated, and temperature may be also swept from the low temperature side to the high temperature side.

In accordance with this embodiment, since the compensating data are extracted by the self compensating operation, it is sufficient to give a start signal and an external reference frequency signal from the exterior, and it is not necessary to give the compensating data from the exterior as in the conventional case. It is not necessary to construct an external arrangement for outputting the compensating data for every individual IC. Therefore, there is no limit of the number of external arrangements, and the compensating data can be simultaneously set for a larger number of ICs, and manufacture cost can be reduced. When a product of a different oscillating frequency is conventionally manufactured, it is necessary to construct the external arrangement in conformity with this oscillating frequency. However, it is not necessary to construct such an external arrangement in the invention so that manufacture cost can be also reduced from this viewpoint. An area occupied by the timing control circuit 7, the frequency comparing circuit 8 and the sequential comparing register 9 is equal to or smaller than an occupying area of an interface, etc. for inputting correction data in the conventional case when these circuits, etc. are integrated in one chip IC. Accordingly, no IC area is increased by this integration.

In the above one embodiment, the temperature compensated crystal oscillator using the AT cut crystal resonator as a resonator is shown, but the invention is not limited to this case. The invention can be also applied to a temperature compensated oscillator using a SAW (Surface Acoustic Wave) resonator.

In accordance with the invention, exact temperature accuracy of the temperature detector and high accuracies of the A/D converter and the D/A converter are not required so that no combining circuit of these devices is used and an IC is easily formed.

Further, a circumferential temperature of the temperature compensated oscillator is swept within a predetermined desirable range, and a temperature change detected by the temperature detector is set to a temperature step, and temperature compensating data are self-extracted every change of this temperature step. Therefore, no exactness of temperature setting is required to extract the temperature compensating data. Therefore, it is not necessary to arrange a constant temperature bath of high accuracy for the temperature setting so that cost of the arrangement can be reduced.

In an external arrangement for extracting the temperature compensating data, it is sufficient to input only a reference frequency and a start signal so that cost of the arrangement can be reduced.

Further, since there is no compensation in approximate characteristics of temperature characteristics of the oscillator, temperature compensation of high accuracy can be realized.

The compensating data are written to a memory in a state in which a digital signal from the A/D converter for converting an analog signal of the temperature detector to the digital signal is set as an address. Therefore, required capacity of the memory can be minimized. Cost of the temperature compensated oscillator can be also reduced from this viewpoint.

What is claimed is:

1. A temperature compensated oscillator comprising:

a temperature detector for outputting an analog temperature signal according to temperature, an A/D converter for converting the analog temperature signal from said temperature detector to a digital address signal, a memory from which compensating data are read using the digital address signal from said A/D converter as an address, a D/A converter for converting said compensating data from the digital signal to analog compensating signal, a variable capacity element being sent the analog compensating signal from said D/A converter as a control voltage of said variable capacity element, and an oscillator circuit for generating an oscillating output signal by oscillating a resonator using said variable capacity element as a frequency adjusting element of said oscillating output signal;

said temperature compensated oscillator comprising a frequency comparing circuit for comparing frequencies of said oscillating output signal and an external reference frequency signal externally inputted, a register for sequentially determining a value of each bit of of a digital register output of said register based on frequency comparing results of said frequency comparing circuit, and a switching circuit for selectively supplying the compensating data read from said memory and the digital register output outputted from said register to said D/A converter;

wherein said oscillator circuit performs an oscillating operation by supplying the digital register output outputted from said register to said D/A converter through said switching circuit;

the frequency of said oscillating output signal being changed by sequentially determining the value of each bit of said digital register output based on the comparing results of said frequency comparing circuit every comparing operation;

the frequency of the oscillating output signal of said oscillator circuit and the frequency of said external reference frequency signal being conformed to each other; and the digital register output outputted from said register at a time when said frequency conforming occurs being written to said memory as said compensating data corresponding to a detecting temperature of said temperature detector every predetermined temperature step in a state in which the digital address signal outputted from said A/D converter in accordance with said detecting temperature at that time is set as an address, wherein said temperature step corresponds to a predetermined changing width of the detecting temperature of said temperature detector, and said temperature step is partitioned when the digital address signal outputted from said A/D converter shows the predetermined changing width.

2. A temperature compensated oscillator comprising:

a temperature detector for outputting an analog temperature signal according to temperature, an A/D converter for converting the analog temperature signal from said temperature detector to a digital address signal, a memory from which compensating data are read using the digital address signal from said A/D converter as an address, a D/A converter for converting said compensating data from the digital signal to analog compensating signal, a variable capacity element being sent the analog compensating signal from said D/A converter as a control voltage of said variable capacity element, and an oscillator circuit for generating an oscillating output signal by oscillating a resonator using said variable capacity element as a frequency adjusting element of said oscillating output signal;

said temperature compensated oscillator comprising a frequency comparing circuit for comparing frequencies of said oscillating output signal and an external reference frequency signal externally inputted, a register for sequentially determining a value of each bit of of a digital register output of said register based on frequency comparing results of said frequency comparing circuit, and a switching circuit for selectively supplying the compensating data read from said memory and the digital register output outputted from said register to said D/A converter;

wherein said oscillator circuit performs an oscillating operation by supplying the digital register output outputted from said register to said D/A converter through said switching circuit;

the frequency of said oscillating output signal being changed by sequentially determining the value of each bit of said digital register output based on the comparing results of said frequency comparing circuit every comparing operation;

the frequency of the oscillating output signal of said oscillator circuit and the frequency of said external reference frequency signal being conformed to each other; and the digital register output outputted from said register at a time when said frequency conforming occurs being written to said memory as said compensating data corresponding to a detecting temperature of said temperature detector every predetermined temperature step in a state in which the digital address signal outputted from said A/D converter in accordance with said detecting temperature at that time is set as an address, wherein said temperature step is narrowly set in a temperature range in which a temperature fluctuation of frequency accuracy of said oscillator becomes large.

3. A temperature compensated oscillator according to any one of claims 1 or 2, wherein said resonator is a crystal resonator, and said variable capacity element is a varicap diode.

4. A manufacturing method of a temperature compensated oscillator comprising:

constructing a temperature compensated oscillator including a temperature detector for outputting an analog temperature signal according to temperature, an A/D converter for converting the analog temperature signal from said temperature detector to a digital address signal, a memory from which compensating data are read using the digital address signal from said A/D converter as an address, a D/A converter for converting said compensating data from the memory to an analog compensating signal, a variable capacity element being sent the analog compensating signal from said D/A converter as a control voltage of the variable capacity element, an oscillator circuit connected to a resonator and generating an oscillating output signal by performing an oscillating operation according to the resonator using said variable capacity element as a frequency adjusting element of said oscillating output signal, a frequency comparing circuit for comparing frequencies of said oscillating output signal and an external reference frequency signal externally inputted, a register for sequentially determining a value of each bit of a digital register output based on frequency comparing results of said frequency comparing circuit, and a switching circuit for selectively supplying the compensating data read from said memory and the digital register output outputted from said register to said D/A converter;

operating said temperature compensated oscillator at a predetermined specific temperature;

inputting said external reference frequency signal to said frequency comparing circuit;

conforming frequency by adjusting said oscillator circuit to perform an oscillating operation by supplying the digital register output outputted from said register to said D/A converter through said switching circuit, and changing the frequency of said oscillating output signal by sequentially determining the value of each bit of said digital register output based on comparing results of said frequency comparing circuit every comparing operation, to conform the frequency of the oscillating output signal of said oscillator circuit to the frequency of said external reference frequency signal;

writing the digital register output outputted from said register, at a time when said frequency of the oscillating output signal and the frequency of said external reference signal conform, to said memory as said compensating data corresponding to a detecting temperature of said temperature detector in a state in which the digital address signal outputted from said A/D converter in accordance with said detecting temperature at that time is set as an address; and performing said writing of said compensating data within a predetermined temperature compensating range to said memory by changing a circumferential temperature of said temperature compensated oscillator at a predetermined speed from said specific temperature so as to cross said predetermined temperature compensating range, and performing said writing operation of said compensating data at each occurrence of said predetermined temperature step, wherein said predetermined temperature step corresponds to a predetermined changing width of the detecting temperature of said temperature detector, and said temperature step is partitioned when the digital signal outputted from said A/D converter shows the predetermined changing width.

5. A manufacturing method of a temperature compensated oscillator comprising:

constructing a temperature compensated oscillator including a temperature detector for outputting an analog temperature signal according to temperature, an A/D converter for converting the analog temperature signal from said temperature detector to a digital address signal, a memory from which compensating data are read using the digital address signal from said A/D converter as an address, a D/A converter for converting said compensating data from the memory to an analog compensating signal, a variable capacity element being sent the analog compensating signal from said D/A converter as a control voltage of the variable capacity element, an oscillator circuit connected to a resonator and generating an oscillating output signal by performing an oscillating operation according to the resonator using said variable capacity element as a frequency adjusting element of said oscillating output signal, a frequency comparing circuit for comparing frequencies of said oscillating output signal and an external reference frequency signal externally inputted, a register for sequentially determining a value of each bit of a digital register output based on frequency comparing results of said frequency comparing circuit, and a switching circuit for selectively supplying the compensating data read from said memory and the digital register output outputted from said register to said D/A converter;

operating said temperature compensated oscillator at a predetermined specific temperature;

inputting said external reference frequency signal to said frequency comparing circuit;

conforming frequency by adjusting said oscillator circuit to perform an oscillating operation by supplying the digital register output outputted from said register to said D/A converter through said switching circuit, and changing the frequency of said oscillating output signal by sequentially determining the value of each bit of said digital register output based on comparing results of said frequency comparing circuit every comparing operation, to conform the frequency of the oscillating output signal of said oscillator circuit to the frequency of said external reference frequency signal;

writing the digital register output outputted from said register, at a time when said frequency of the oscillating output signal and the frequency of said external reference signal conform, to said memory as said compensating data corresponding to a detecting temperature of said temperature detector in a state in which the digital address signal outputted from said A/D converter in accordance with said detecting temperature at that time is set as an address; and performing said writing of said compensating data within a predetermined temperature compensating range to said memory by changing a circumferential temperature of said temperature compensated oscillator at a predetermined speed from said specific temperature so as to cross said predetermined temperature compensating range, and performing said writing operation of said compensating data at each occurrence of said predetermined temperature step, wherein said temperature step is narrowly set in a temperature range in which a temperature fluctuation of frequency accuracy of said oscillator becomes large.

6. A manufacturing method of a temperature compensated oscillator according to claims 4 or 5, wherein said resonator is a crystal resonator, and said variable capacity element is a varicap diode.

7. A manufacturing method of a temperature compensated oscillator comprising:

constructing a temperature compensated oscillator including a temperature detector for outputting an analog temperature signal according to temperature, an A/D converter for converting the analog temperature signal from said temperature detector to a digital address signal, a memory from which compensating data are read using the digital address signal from said A/D converter as an address, a D/A converter for converting said compensating data from the memory to an analog compensating signal, a variable capacity element being sent the analog compensating signal from said D/A converter as a control voltage of the variable capacity element, an oscillator circuit connected to a resonator and generating an oscillating output signal by performing an oscillating operation according to the resonator using said variable capacity element as a frequency adjusting element of said oscillating output signal, a frequency comparing circuit for comparing frequencies of said oscillating output signal and an external reference frequency signal externally inputted, a register for sequentially determining a value of each bit of a digital register output based on frequency comparing results of said frequency comparing circuit, and a switching circuit for selectively supplying the compensating data read from said memory and the digital register output outputted from said register to said D/A converter;

operating said temperature compensated oscillator at a predetermined specific temperature;

inputting said external reference frequency signal to said frequency comparing circuit;

conforming frequency by adjusting said oscillator circuit to perform an oscillating operation by supplying the digital register output outputted from said register to said D/A converter through said switching circuit, and changing the frequency of said oscillating output signal by sequentially determining the value of each bit of said digital register output based on comparing results of said frequency comparing circuit every comparing operation, to conform the frequency of the oscillating output signal of said oscillator circuit to the frequency of said external reference frequency signal;

writing the digital register output outputted from said register, at a time when said frequency of the oscillating output signal and the frequency of said external reference signal conform, to said memory as said compensating data corresponding to a detecting temperature of said temperature detector in a state in which the digital address signal outputted from said A/D converter in accordance with said detecting temperature at that time is set as an address; and performing said writing of said compensating data within a predetermined temperature compensating range to said memory by changing a circumferential temperature of said temperature compensated oscillator at a predetermined speed from said specific temperature so as to cross said predetermined temperature compensating range, and performing said writing operation of said compensating data at each occurrence of said predetermined temperature step, wherein said specific temperature lies outside said predetermined temperature range.

8. An integrated circuit for a temperature compensated oscillator comprising:

an A/D converter for converting an analog temperature signal from a temperature detector to a digital address signal, a memory from which compensating data are read using the digital address signal from said A/D converter as an address, a D/A converter for converting said compensating data from the digital signal to analog compensating signal, a variable capacity element being sent the analog compensating signal from said D/A converter as a control voltage of said variable capacity element, an oscillator circuit for externally connecting to a resonator and generating an oscillating output signal by oscillating the resonator using said variable capacity element as a frequency adjusting element of said oscillating output signal, a frequency comparing circuit for comparing frequencies of said oscillating output signal and an external reference frequency signal externally inputted, a register for sequentially determining a value of each bit of of a digital register output of said register based on frequency comparing results of said frequency comparing circuit, and a switching circuit for selectively supplying the compensating data read from said memory and the digital register output outputted from said register to said D/A converter;

wherein said oscillator circuit performs an oscillating operation by supplying the digital register output outputted from said register to said D/A converter through said switching circuit;

the frequency of said oscillating output signal being changed by sequentially determining the value of each bit of said digital register output based on the comparing results of said frequency comparing circuit every comparing operation;

the frequency of the oscillating output signal of said oscillator circuit and the frequency of said external reference frequency signal being conformed to each other; and the digital register output outputted from said register at a time when said frequency conforming occurs being written to said memory as said compensating data corresponding to a detecting temperature of said temperature detector every predetermined temperature step in a state in which the digital address signal outputted from said A/D converter in accordance with said detecting temperature at that time is set as an address, wherein said temperature step corresponds to a predetermined changing width of the detecting temperature of said temperature detector, and said temperature step is partitioned when the digital address signal outputted from said A/D converter shows the predetermined changing width.

9. An integrated circuit for a temperature compensated oscillation comprising:

an A/D converter for converting an analog temperature signal from a temperature detector to a digital address signal, a memory from which compensating data are read using the digital address signal from said A/D converter as an address, a D/A converter for converting said compensating data from the digital signal to analog compensating signal, a variable capacity element being sent the analog compensating signal from said D/A converter as a control voltage of said variable capacity element, an oscillator circuit for externally connecting to a resonator and generating an oscillating output signal by oscillating the resonator using said variable capacity element as a frequency adjusting element of said oscillating output signal, a frequency comparing circuit for comparing frequencies of said oscillating output signal and an external reference frequency signal externally inputted, a register for sequentially determining a value of each bit of of a digital register output of said register based on frequency comparing results of said frequency comparing circuit, and a switching circuit for selectively supplying the compensating data read from said memory and the digital register output outputted from said register to said D/A converter;

wherein said oscillator circuit performs an oscillating operation by supplying the digital register output outputted from said register to said D/A converter through said switching circuit;

the frequency of said oscillating output signal being changed by sequentially determining the value of each bit of said digital register output based on the comparing results of said frequency comparing circuit every comparing operation;

the frequency of the oscillating output signal of said oscillator circuit and the frequency of said external reference frequency signal being conformed to each other; and the digital register output outputted from said register at a time when said frequency conforming occurs being written to said memory as said compensating data corresponding to a detecting temperature of said temperature detector every predetermined temperature step in a state in which the digital address signal outputted from said A/D converter in accordance with said detecting temperature at that time is set as an address, wherein said temperature step is narrowly set in a temperature range in which a temperature fluctuation of frequency accuracy of said oscillator becomes large.

10. An integrated circuit for temperature compensated oscillation according to claims 8 or 9, wherein said resonator is a crystal resonator, and said variable capacity element is a varicap diode.

* * * * *